(12) United States Patent
Berkhout

(10) Patent No.: US 6,476,672 B2
(45) Date of Patent: Nov. 5, 2002

(54) FOUR PHASE LEVEL SHIFT CIRCUIT FOR USE IN A PUSH-PULL AMPLIFIER

(75) Inventor: Marco Berkhout, Nijmegen (NL)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/864,144

(22) Filed: May 24, 2001

(65) Prior Publication Data
US 2002/0000878 A1 Jan. 3, 2002

(30) Foreign Application Priority Data
May 25, 2000 (EP) .............................. 00201826

(51) Int. Cl.[7] ................................ H03F 3/38
(52) U.S. Cl. .................... 330/10; 375/238; 330/207 A; 330/251
(58) Field of Search .............................. 230/10, 207 A, 230/251; 375/238

(56) References Cited

FOREIGN PATENT DOCUMENTS

| EP | A10397241 | 5/1990 | .......... H03K/17/16 |
|---|---|---|---|
| EP | 798858 | * 1/1997 | |

OTHER PUBLICATIONS

Tomita Hiroo; "Arm Shortproof Circuit of Transistor Converter", Fuji Electric Co, Ltd; May 1988, Patent Abstracts of Japan, vol. 012, No. 162, JP62272878.

* cited by examiner

Primary Examiner—Michael B Shingleton
(74) Attorney, Agent, or Firm—Steven R. Biren

(57) ABSTRACT

A push-pull amplifier has a level shift circuit to generate different control signals to a driver of a switch. The amplifier has to cope with the voltage limitations of the device. To reduce stand by power the level shifter is used. The solution of the invention has as one of its advantages that a current will flow only during transitions.

3 Claims, 5 Drawing Sheets

FOUR PHASE LEVEL SHIFT CIRCUIT FOR USE IN A PUSH-PULL AMPLIFIER

BACKGROUND OF THE INVENTION

The invention further relates to a level shift circuit for use in such a push-pull amplifier.

The invention further relates to a method of level shifting signals.

From the "Proceedings of the IEEE 1995 Custom Integrated Circuits Conference May 1–4, 1995" a push-pull amplifier is known. One of the items of class D amplifier is that the class D amplifier has the cope with the voltage limitations of the device. To reduce standby power dissipation herein a level shifter is proposed.

A disadvantage of this known push-pull amplifier and level shift circuit is that the herein-proposed solution can only be used with complementary power transistors.

SUMMARY OF THE INVENTION

It is an object of the invention to propose a push-pull amplifier and a level shift circuit, which not have the advantages of the known. To this end a class D amplifier according to the invention comprises the features as claimed in claim 1.

Embodiments of the invention are described in the dependent claims.

Herewith a cross-reference is made to the following co-pending applications of the same applicant and of the same date:

"Carrousel handshake" applicant's ref. Nr. ID603908, Application No. 0 201 818.2

"Silent start" applicant's ref. Nr. ID604681, Application No. 0 201 827.3

"PWM limiter" applicant's ref. Nr. ID604682, Application No. 0 201 828.1

"Demodulation filter" applicant's ref Nr. ID604683, Application No. 0 201 829.9.

BRIEF DESCRIPTION OF THE DRAWING

These and other aspects of the invention will be apparent from and elucidated with reference to the examples described hereinafter. Herein shows.

DESCRIPTION OF THE PREFERRED EMBODIMENTS

Figure 1:
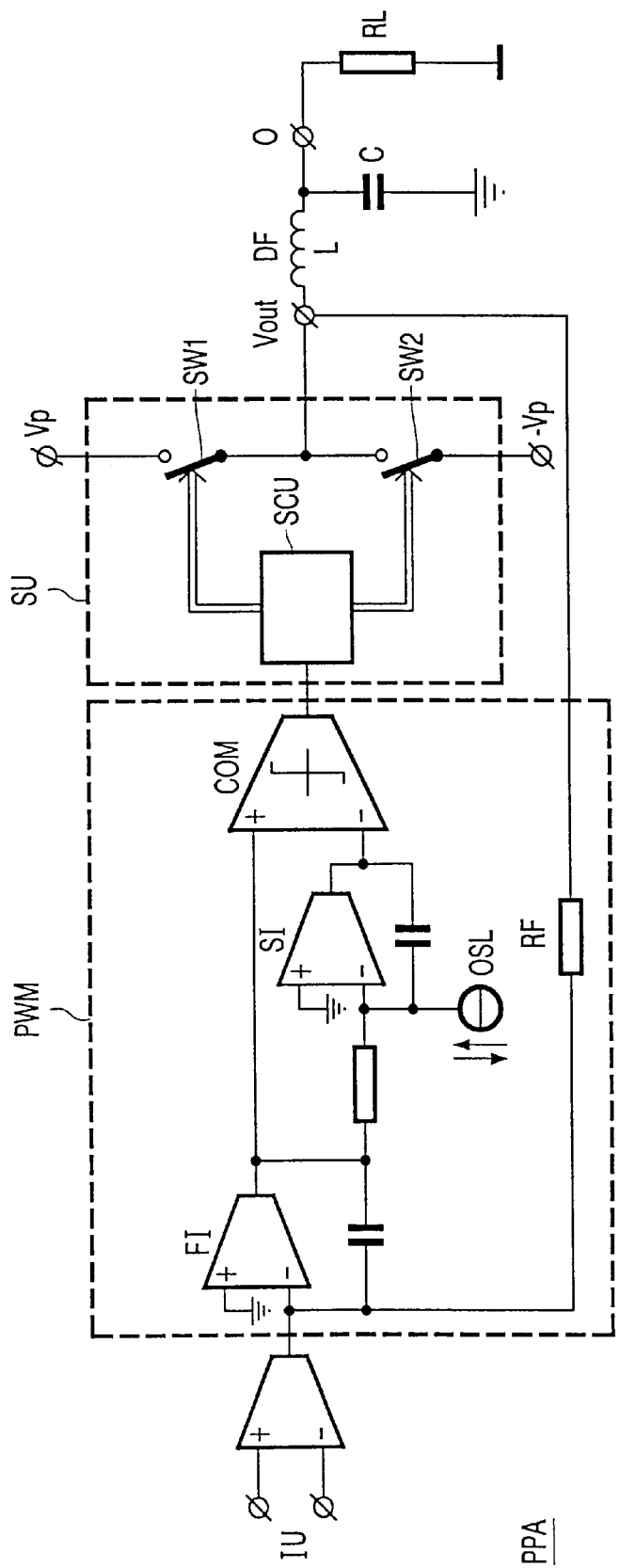
FIG. 1 schematically an example of a push-pull amplifier.

FIG. 1 shows block-schematic an example of a push-pull amplifier PPA according to the invention. Via an input unit IU the amplifier receives the input signal. The input unit is coupled to a pulse-width modulator PWM, which is coupled with an output to a switching unit SU. The switching unit supplies an output signal via a demodulation filter DF to the output O of the amplifier. The pulse-width modulator is coupled in a feedback loop with a feedback element RF that is coupled with one side to the output of the switching unit SU and with the other side to the input of the pulse-width modulator. The pulse-width modulator further comprises a first integrator FI and a second integrator SI and a comparator COM, the input of the first integrator is coupled to the output of the input unit IU and the input of the second integrator is coupled to an output of the first integrator FI and also coupled to an oscillator OSC.

Instead of two integrators it is also possible to use only one integrator. At the inverting input of the comparator for example a saw tooth signal can be supplied.

The switching unit SU comprises a switch control unit SCU and a first and second switch SW1, SW2, respectively. The demodulation filter is in this example shown as an inductance L and a capacitance C can be a second order low-pass demodulation filter, or higher order demodulation filter.

In order to be robust against process and temperature variations it is undesirable to let the timing of the switching be determined by on-chip timeconstants. Therefore, it has been decided to use a handshake procedure to control the switch timing. A circuit is added to both lowside and highside switch that generates a ready signal if the corresponding switch is off. The state of the switch can easily be detected by measuring the gate-source voltage of the DMOS transistor. If it is lower than the threshold voltage the switch is off, if it is higher than the threshold voltage the switch is on. In practice the exact decision level is not very critical. Due to the latch in the driver, the gate-source voltage is either at 0V or at 12V while the transitions between these two levels are very fast.

The handshake procedure forces a specific sequence in which the set and reset signals are generated. To illustrate this, consider the situation that the output of the switching unit is in the low position, i.e. the lowside switch is on and the highside switch is off. In this situation the readylow, resetlow and sethigh signals are low while the readyhigh and resethigh signals are high (I). The value of the setlow signal is not important since the lowside switch has already been set so it will be assumed low. In this situation the handshake logic waits for a transition at the input in. Now the following sequence of events will take place. First, the resetlow signal goes high (II) and the resethigh signal goes low (III). These events can also take place at the same time but for safety an overlap of reset signals is preferred. Following the resetlow signal the lowside switch switches off, the highside driver was already reset, removing the resethigh signal does not affect the highside. When the lowside switch is off the readylow signal will go high. As soon as this happens the sethigh signal goes high (IV). Following sethigh the highside switch switches on. When the highside switch is on the readyhigh signal will go low. As soon as this happens the sethigh signal can be made low again (V). Now the output of the switching unit is in the high position. The transition back to the low position is executed in a similar manner.

Figure 2:
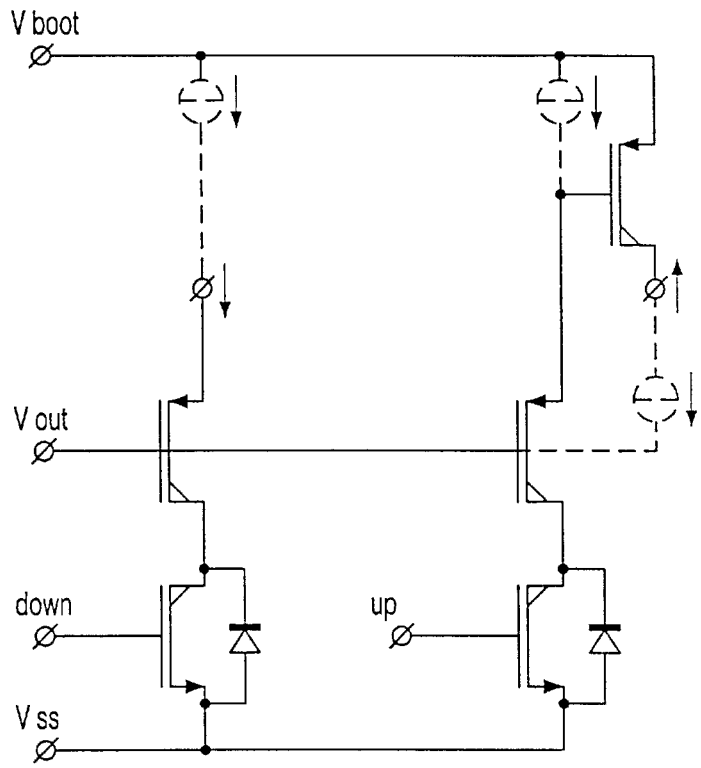
FIG. 2 a circuit with pull down and pull up transistors.

In general pull-down transistors are capable of pulling down a node on a higher level almost instantaneously. Pulling down the node back up again can only be done fast indirectly with a "pull-up" transistor as illustrated in FIG. 2.

In both situations a current source is required to recover to the original situation.

Fast recovery requires large currents. The use of the continuous current sources is undesirable since then these (large) currents flow through the pull down and shutter transistors continuously. Switching of the current sources by cross coupling the circuits results in a regenerative loop, which exhibits the undesired delay described earlier. The regenerative loop can easily be broken by adding a third signal. Consider the situation shown in FIG. 3. Three signals $\Phi_1$, $\Phi_2$ and $\Phi_3$ are sequentially high. If $\Phi_1$ is high it pulls down node $N_1$, directly through shutter $M_2$ and pulls up node $N_3$ indirectly through pull-up $M_9$. This switches off pull-up $M_6$ and leaves $N_2$ floating (high). Next $\Phi_2$ goes high, pulls down $N_2$, pulls up $N_1$ and switches off $M_9$. Next $\Phi_3$ goes high, etc. in this circuit each pull-up transistor is switched off before the corresponding pull-down transistor is switched on and vice versa.

Figure 3:
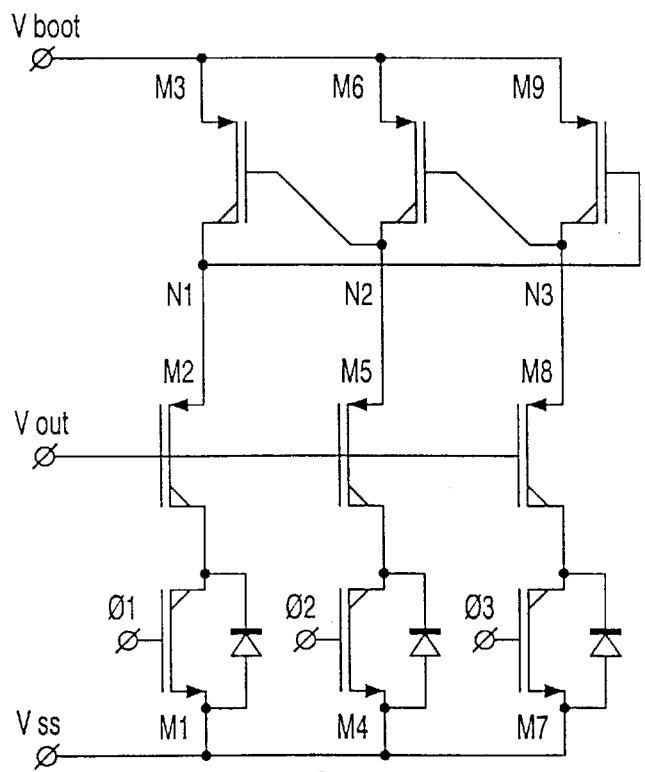
FIG. 3 a three phase level shift circuit.

The circuit of FIG. 3 can also be realized in a four-phase version. Although this seems to be unpractical it starts to make sense when it is considered that the reset signals for the latch are generated by the carrousel described above.

Figure 4:
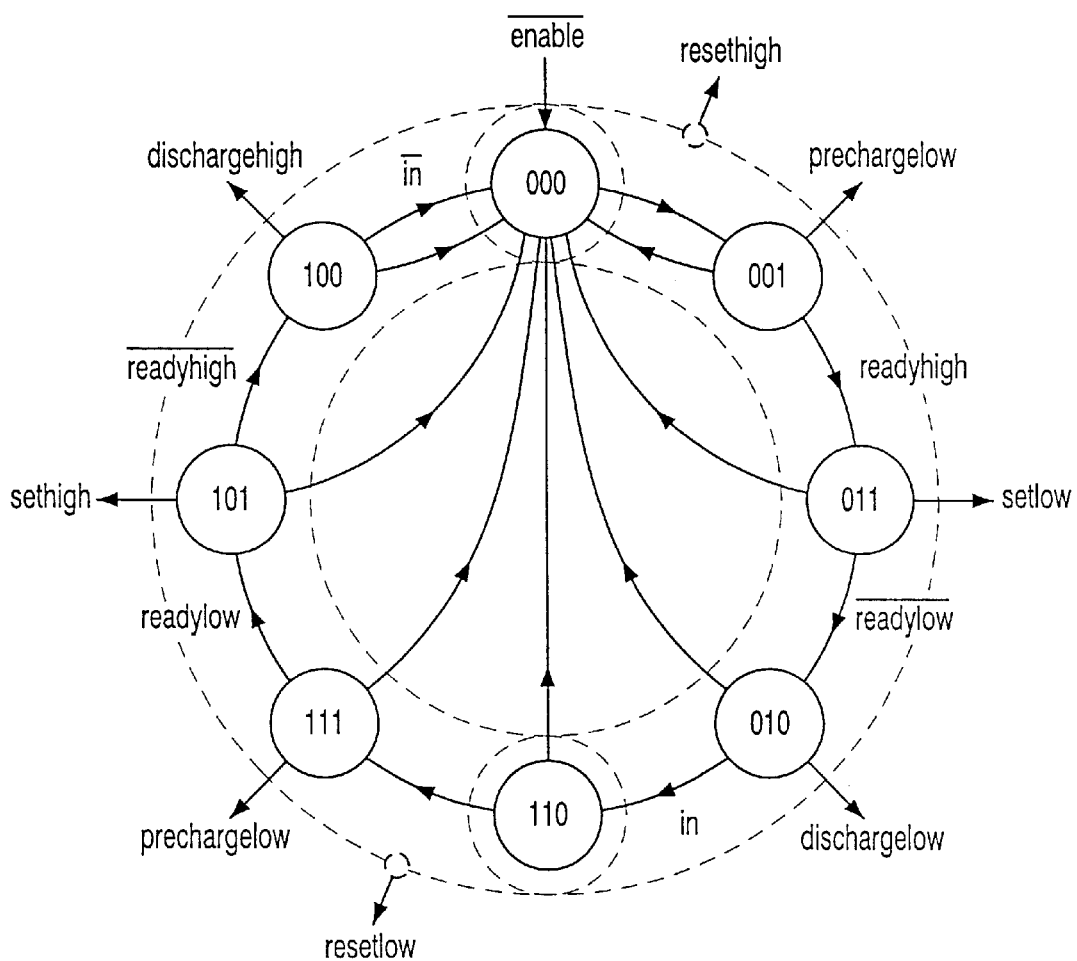
FIG. 4 a state transition diagram.

The set and reset signals are generated in a predefined sequence by a state machine. It is easy to decode some additional signals in order to drive a four phase level shift as shown in the state transition diagram in FIG. 4.

These additional signals essentially serve to prepare the driver latch for a set or a reset signal. The actual thing can be done with pull-up transistors.

The main problem in implementing the system (push-pull amplifier) described previously is the transfer of signals between the carrousel and the highside driver. The binary signals in the carrousel are between the $V_{ss}$ and $V_{stabi}$ rails while the binary signals in the highside driver are between the $V_{out}$ and $V_{boot}$ rails where $V_{out}$ equals $V_{ss}$ or $V_{dd}$ or is in a steep transient between these two levels. Clearly the transfer of the set and reset signals from carrousel to highside driver and ready signal from highside driver to carrousel has to be insensitive to the voltage transient at the output of the switching unit.

The use of continuous current sources is undesirable since then these (large) currents flow through the pulldown and shutter transistors continuously. Switching of the current sources by cross-coupling the circuits results in a regenerative loop which exhibits the undesired delay described earlier. The regenerative loop can easily be broken by adding a third signal. Consider the situation shown in FIG. 3. Three signals $\phi_1$, $\phi_2$ and $\phi_3$ are sequentially high. If $\phi_1$ is high it pulls down node $N_1$ directly through shutter $M_2$ and pulls up node $N_3$ indirectly through pull-up $M_9$. This switches off pull-up $M_6$ and leaves $N_2$ floating (high). Next $\phi_2$ goes high, pulls down $N_2$, pulls up $N_1$ and switches off $M_9$. Next $\phi_3$ goes high, etc. In this circuit each pull-up transistor is switched off before the corresponding pull-down transistor is switched on and vice versa.

Obviously, the circuit in FIG. 3 can also be realized in a four-phase version. Although this seems to be unpractical it starts to make sense when it is considered that the set and reset signals for the latch are generated by the carrousel described in the previous section. The set and reset signals are generated by the carrousel described in the previous section. The set and reset signals are generated in a predefined sequence by a state machine. It is very easy to decode some additional signals in order to drive a four-phase level shift as shown in the state transition diagram in FIG. 4.

Figure 5:
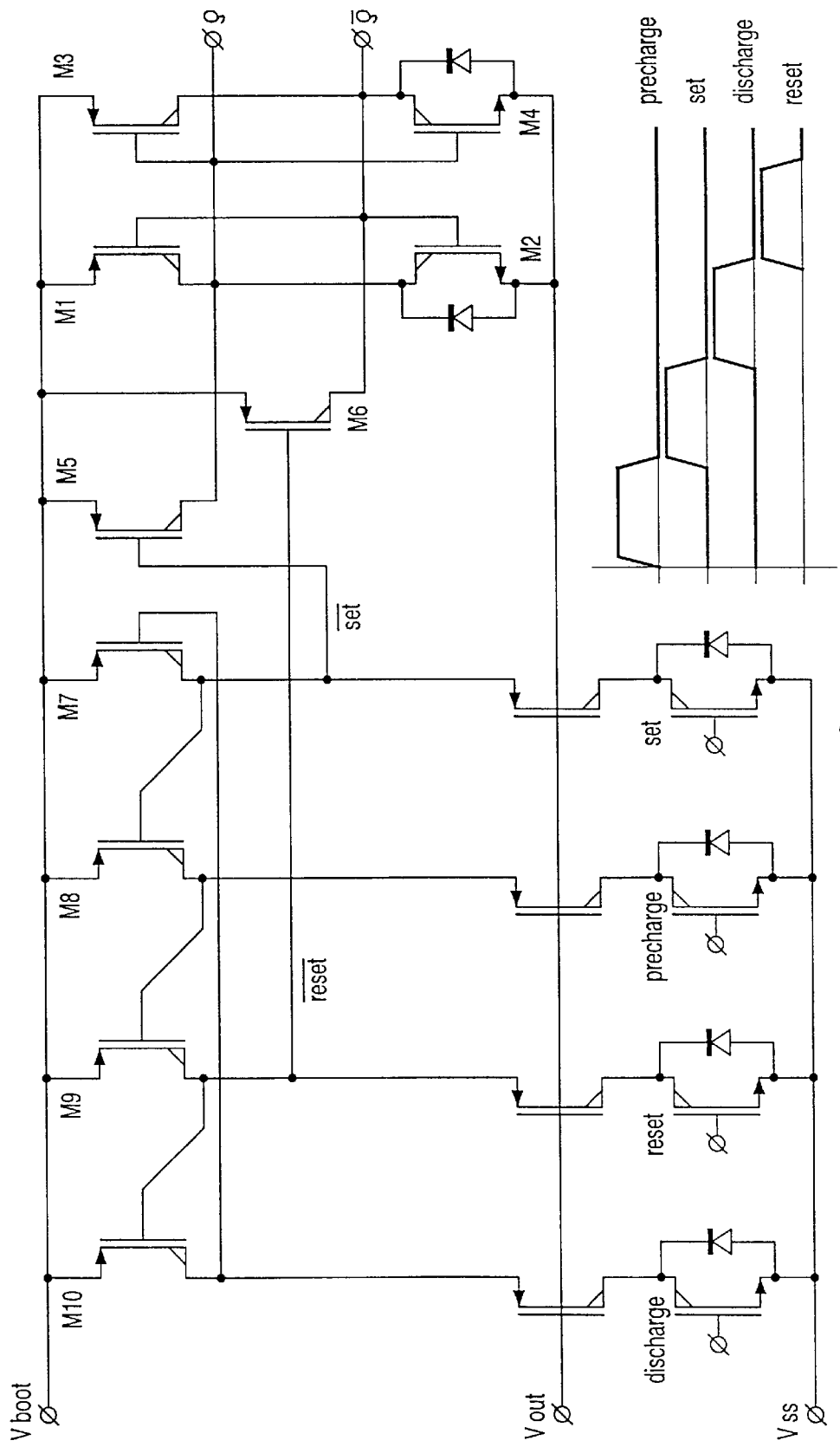
FIG. 5 a basic four stroke level shift and ledge circuit

The resulting circuit is shown in FIG. 5 and is called the four-stroke. The name four-stroke is derived from the superficial similarity with the four phases of operation of a four-stroke combustion engine. If the set signal is high the gate of pull-up transistor $M_5$ is pulled down and the latch is set. Then the discharge signal goes high and the gate of $M_5$ is pulled up again indirectly. Next the reset signal goes high and pulls down the gate of $M_6$, which resets the latch. Finally, the precharge signal pulls up the gate of $M_6$ again.

In general, if one of the signals driving the four-stroke is high, the corresponding node is pulled down, the adjacent node is pulled up while the two remaining nodes are floating and thus susceptible to capacitive coupling or leakage currents. Although this is generally undesirable it can cause problems in two cases in particular.

First, as long as the switching unit is disabled, both highside and lowside driver remain reset indefinitely. In this case the gate of $M_9$ is floating and can assume any voltage. Consequently $M_9$ may be turned on resulting in a resistive channel between $V_{boot}$ and $V_{ss}$.

Second, consider the following situation. The carrousel is in state 110 while the output of the switching unit is on the lowside. When the carrousel progresses to state 111 the resethigh signal goes low while the prechargehigh signal goes high, pulling down the gate of $M_9$ and thus indirectly pulling up the gate of $M_6$. Next, after readylow confirmation the carrousel progresses to state 101. Consequently the prechargehigh signal goes low while the sethigh signal goes high pulling down the gates of $M_5$ and $M_8$ and indirectly pulling up the gate of $M_9$ leaving the gate of $M_6$ floating. Because the latch is now set, the output of the switching unit will make a fast transition to the highside. Because of parasitic capacitance it is now possible that the gate of $M_6$ is pulled down thus opening $M_6$ is pulled down thus opening $M_6$ which counteracts the set effect of $M_5$.

Figure 6:
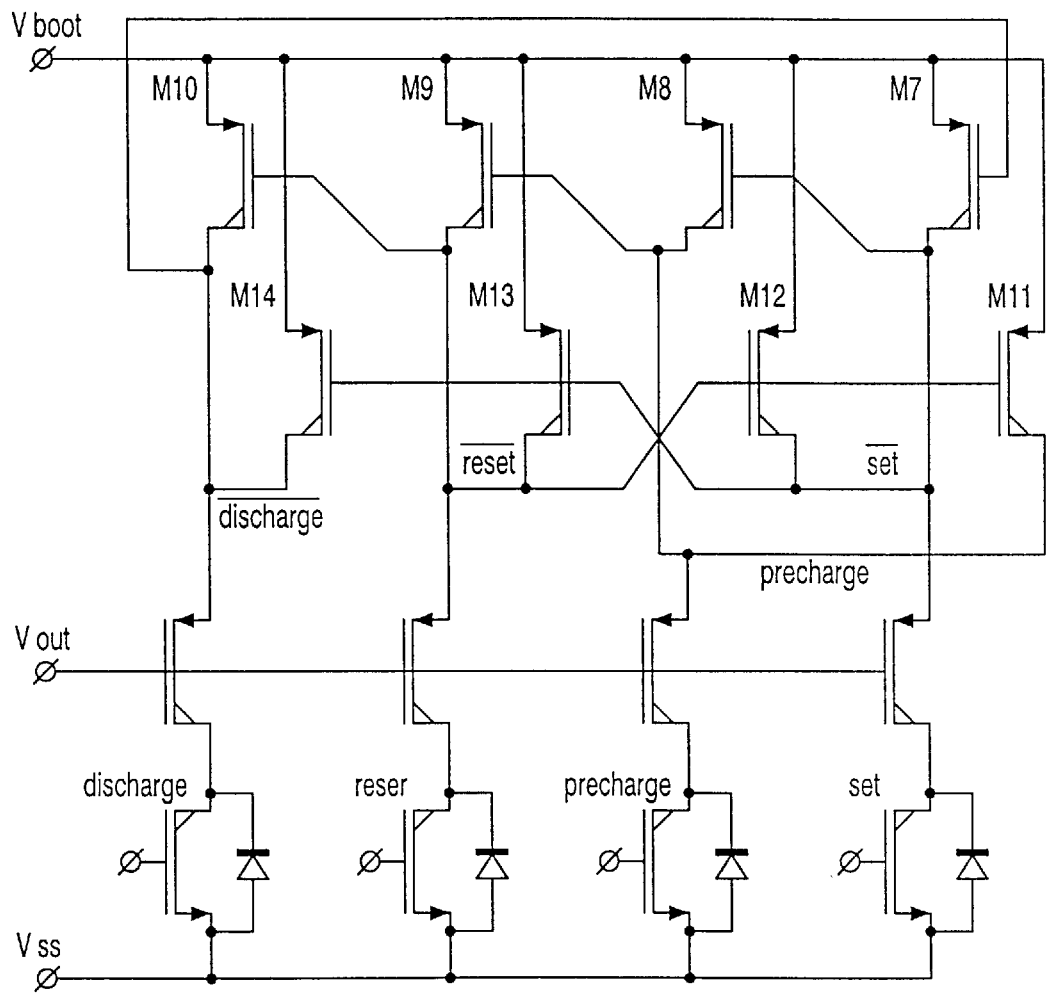
FIG. 6 a second example of a four-stroke level shift circuit.

Both problems can be solved by additional pull-up transistors as shown in FIG. 6. As can be seen in figure both set band reset signals cause all other nodes to be pulled-up. Note that transistors $M_{14}$ and $M_{12}$ counteract the operation of $M_7$ and $M_9$ respectively. In order not to re-create the original problem $M_{14}$ and $M_{11}$ should be made much smaller than $M_7$ and $M_9$. Transistors $M_{13}$ and $M_{12}$ do not influence the switching speed since they are not used to switch but only to maintain the present state.

What is claimed is:

1. Push-pull amplifier having an input for receiving an input signal and an output for supplying an output signal, which push-pull amplifier comprises a pulse width modulator comprising at least two integrators, a comparator and a feed back element, switching unit having at least two switches coupled to the output of the pulse width modulator and a demodulator filter coupled to the output of the switching unit characterized in that a switching unit comprises a four phase level shift circuit for generating four different control signals to at least one driver of at least one switch.

2. Push-pull amplifier as claimed in claim 1 characterized in that the push-pull amplifier is class D amplifier.

3. Level shift circuit for use in a push-pull amplifier as claimed in claim 1.

* * * * *

UNITED STATES PATENT AND TRADEMARK OFFICE
CERTIFICATE OF CORRECTION

PATENT NO.    : 6,476,672 B2
DATED         : November 5, 2002
INVENTOR(S)   : Marco Berkhout It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-second Day of July, 2003

JAMES E. ROGAN
*Director of the United States Patent and Trademark Office*